(12) United States Patent
Trivedi et al.

(10) Patent No.: US 7,811,889 B2
(45) Date of Patent: Oct. 12, 2010

(54) FINFET MEMORY CELL HAVING A FLOATING GATE AND METHOD THEREFOR

(75) Inventors: Vishal P. Trivedi, Chandler, AZ (US); Leo Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 388 days.

(21) Appl. No.: 11/835,548

(22) Filed: Aug. 8, 2007

(65) Prior Publication Data

US 2009/0039420 A1   Feb. 12, 2009

(51) Int. Cl.
H01L 21/336 (2006.01)
(52) U.S. Cl. .............. 438/266; 257/E21.219
(58) Field of Classification Search .......... 257/329, 257/347, 316, E21.219; 438/149, 479, 266
See application file for complete search history.

(56) References Cited

U.S. PATENT DOCUMENTS

| | | | |
|---|---|---|---|
| 6,657,252 B2 * | 12/2003 | Fried et al. ............ 257/316 |
| 7,018,876 B2 | 3/2006 | Mathew et al. | |
| 7,091,551 B1 | 8/2006 | Anderson et al. | |
| 7,285,820 B2 * | 10/2007 | Park et al. .............. 257/316 |
| 2006/0278915 A1 * | 12/2006 | Lee et al. ............... 257/315 |
| 2007/0212834 A1 * | 9/2007 | Anderson et al. ......... 438/257 |
| 2008/0080248 A1 * | 4/2008 | Lue et al. .............. 365/185.18 |
| 2009/0032859 A1 * | 2/2009 | Zhu ..................... 257/316 |

* cited by examiner

*Primary Examiner*—Nathan W Ha
(74) *Attorney, Agent, or Firm*—James L. Clingan, Jr.; Robert L. King

(57) ABSTRACT

A fin field effect transistor (FinFET) memory cell and method of formation has a substrate for providing mechanical support. A first dielectric layer overlies the substrate. A fin structure overlies the dielectric layer and has a first current electrode and a second current electrode separated by a channel. A floating gate has a vertical portion that is adjacent to and electrically insulated from a side of the channel and has a horizontal portion overlying the first dielectric layer and extending laterally away from the channel. The floating gate stores electrical charge. A second dielectric layer is adjacent the floating gate. A control gate adjacent the second dielectric layer and physically separated from the floating gate by the second dielectric layer. The "L-shape" of the floating gate enhances capacitive coupling ratio between the control gate and the floating gate.

17 Claims, 6 Drawing Sheets

FINFET MEMORY CELL HAVING A FLOATING GATE AND METHOD THEREFOR

BACKGROUND

1. Field

This disclosure relates generally to integrated circuits, and more specifically, to memory cells that use a fin as a channel and have a floating gate.

2. Related Art

Typical non-volatile memories (NVMs) have layer of storage material, which is commonly a floating gate of polysilicon, that is between a channel and a control gate. The NVM can be programmed and erased by moving electrons or holes to and from the floating gate. A common technique is for the charge to move between the channel side and the floating gate for both program and erase. In order to achieve the charge transfer there must be enough voltage between the floating gate and the channel side regardless of the particular technique chosen such as hot carrier injection or tunneling. A voltage cannot be applied directly to the floating gate because it is floating so the voltage at the floating gate is induced by the voltage between the control gate and the channel. The voltage on the floating gate is controlled by voltage division between the floating gate to channel capacitance and the floating gate to control gate capacitance. Thus for programming and erasing it is desirable for the floating gate to control gate capacitance to be large compared to the floating gate to channel capacitance. For reading the state of the memory cell, however, it is desirable for the floating gate to channel capacitance to be high. Thus increasing the ratio of the floating gate to control gate capacitance to the floating gate to channel capacitance is not likely to be possible by reducing the floating gate to channel capacitance. Thus, the voltage on the control gate may need to be quite high in order to achieve the needed voltage on the floating gate. This places further requirements on the memory cell and in particular the insulating layer between the control gate and the floating gate.

Thus there is a need to improve the ratio of the floating gate to control gate capacitance to the floating gate to channel capacitance while not requiring a reduction in the capacitance of the floating gate to channel capacitance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a FinFET has a floating gate that has one portion separated from the side of the fin by a gate dielectric and another portion extending laterally away from the fin. A control gate is separated from the floating gate by an insulating layer. The capacitance between the control gate and the floating gate has two major components. One is the area along the sidewall of the fin where the channel is. Another is the area where the floating gate extends laterally away from the fin. The result is that the capacitance that is added by the lateral extension of the floating gate has significant contribution to the floating gate to control gate capacitance with minimal if any contribution to the floating gate to channel contribution. This has the affect then of increasing the ratio of the floating gate to control gate capacitance to the floating gate to channel capacitance. This is desirable in requiring a lower control gate to channel voltage for a given voltage induced at the floating gate. In the alternative, a higher voltage is induced at the floating gate for a given voltage applied between the control gate and channel. This is better understood with reference to the figures and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
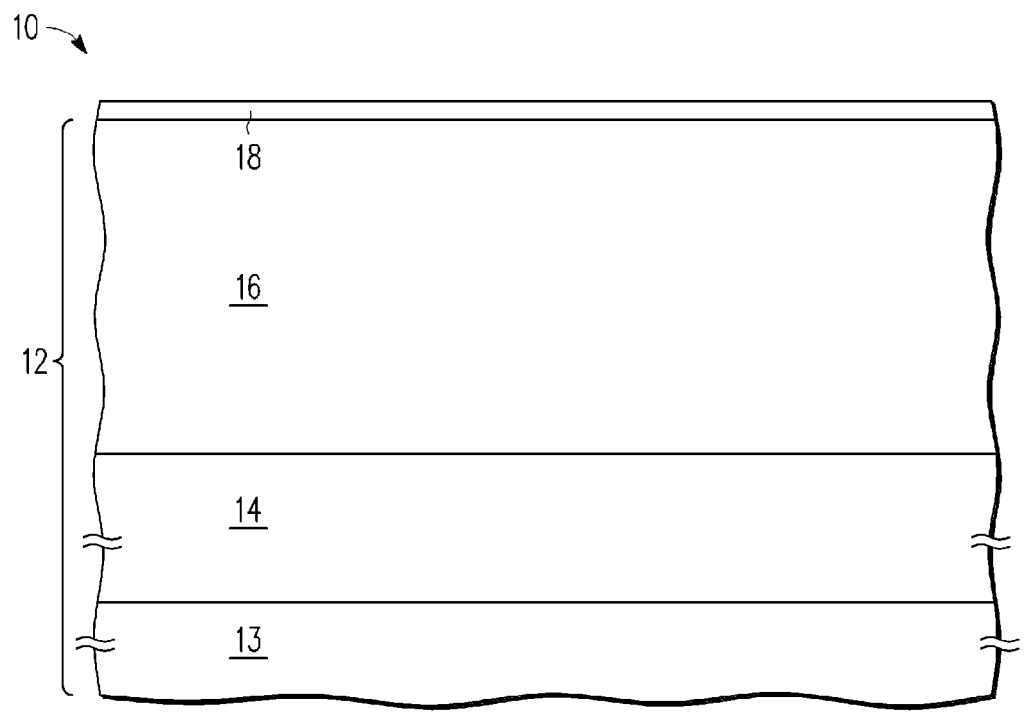
FIG. 1 is a cross section of a semiconductor device at a stage in processing according to one embodiment.

Shown in FIG. 1 is a semiconductor device 10 comprising a substrate 12 and an insulating layer 18 on substrate 12. Substrate 12 in this example is an SOI substrate comprising a supporting layer 13, an insulating layer 14 on supporting layer 13, an a semiconductor layer 16. Supporting layer provides mechanical support and is much thicker than layer 14. Layer 14 may be oxide. Semiconductor layer 16 may be silicon that is about 100 nanometers (nm) thick. Insulating layer 18 may be about 5 nm thick and primarily nitride with a very thin layer of oxide between the nitride and semiconductor layer 16.

Figure 2:
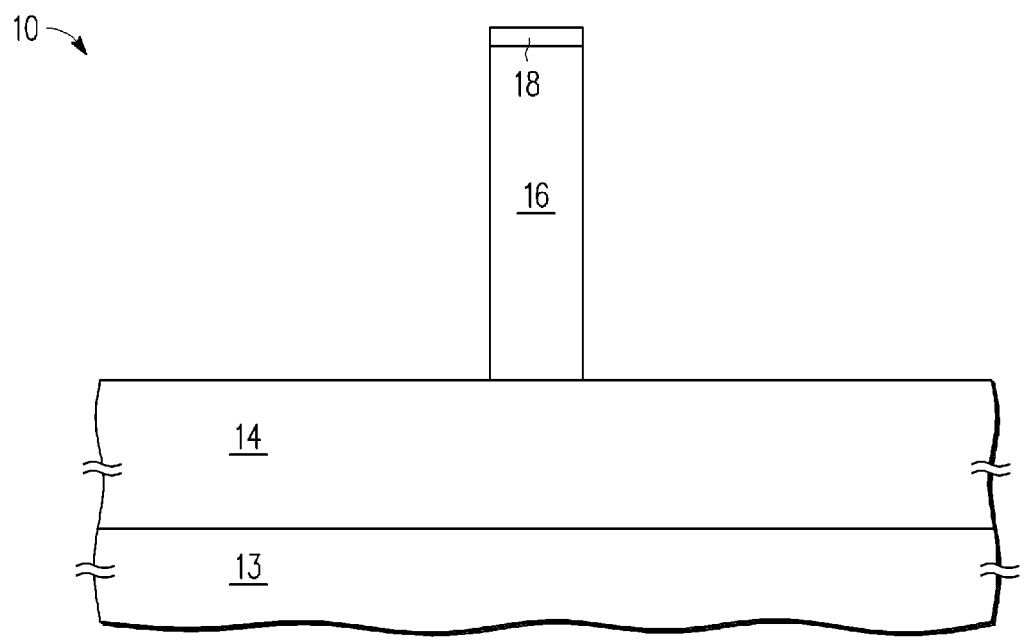
FIG. 2 is a cross section of the semiconductor device of FIG. 1 at a subsequent stage in processing.

Shown in FIG. 2 is semiconductor device 10 after insulating layer 18 and semiconductor layer 16 have been patterned. Patterned insulating layer 18 functions as a hard mask during the etching of layer 16. The etching results in a fin structure which will be referenced as fin 16.

Figure 3:
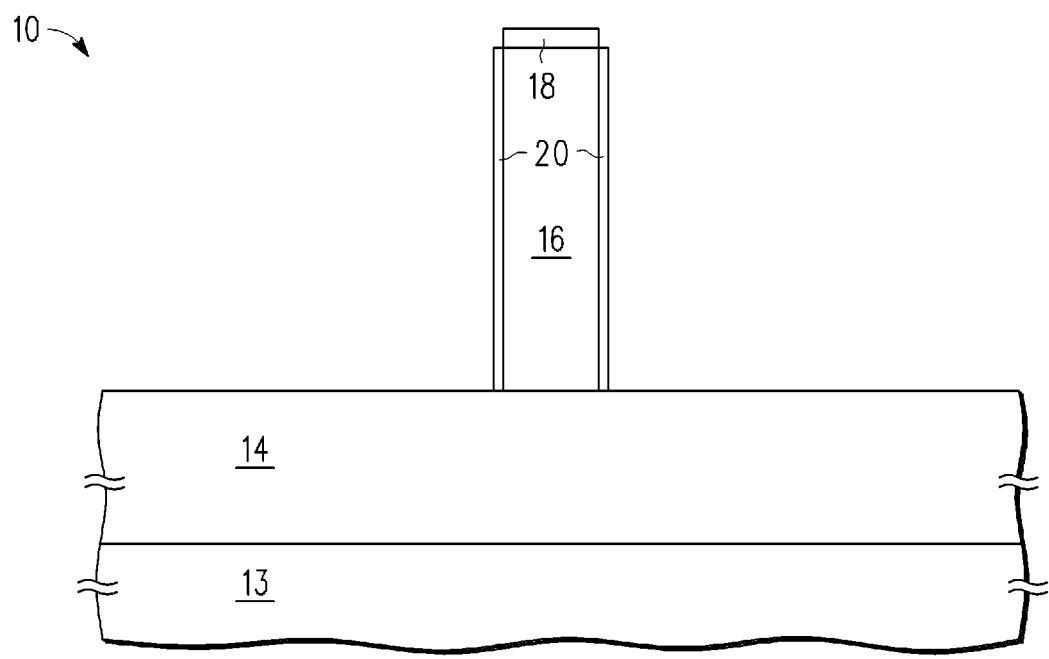
FIG. 3 is a cross section of the semiconductor device of FIG. 1 at a subsequent stage in processing.

Shown in FIG. 3 is semiconductor device 10 after formation of an insulating layer 20 on the sides of fin 16. This is may be a grown oxide that may be about 1 nm thick. This thickness can vary greatly. Insulating layer 20 may even be 15 nm. Insulating layer 20 is for use as a gate dielectric and may be referenced as gate dielectric 20.

Figure 4:
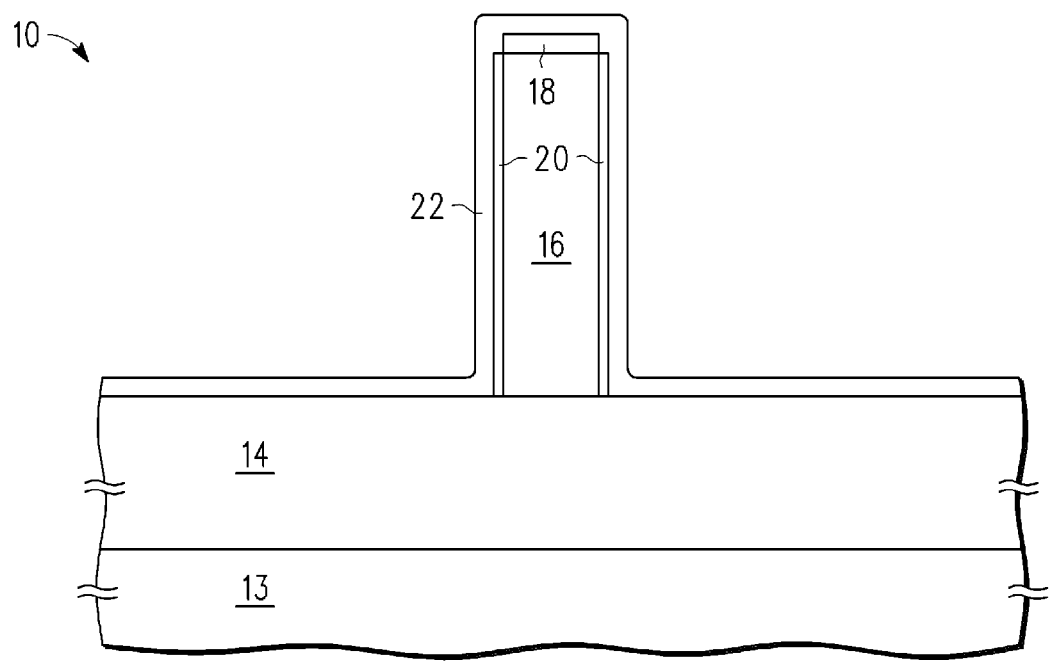
FIG. 4 is a cross section of the semiconductor device of FIG. 1 at a subsequent stage in processing.

Shown in FIG. 4 is semiconductor device 10 after forming a polysilicon layer 22 over gate dielectric 20, insulating layer 14, and the remaining portion of insulating layer 18. Polysilicon layer 22 may be 10 nm thick and may vary, for example from 5 to 25 nm.

Figure 5:
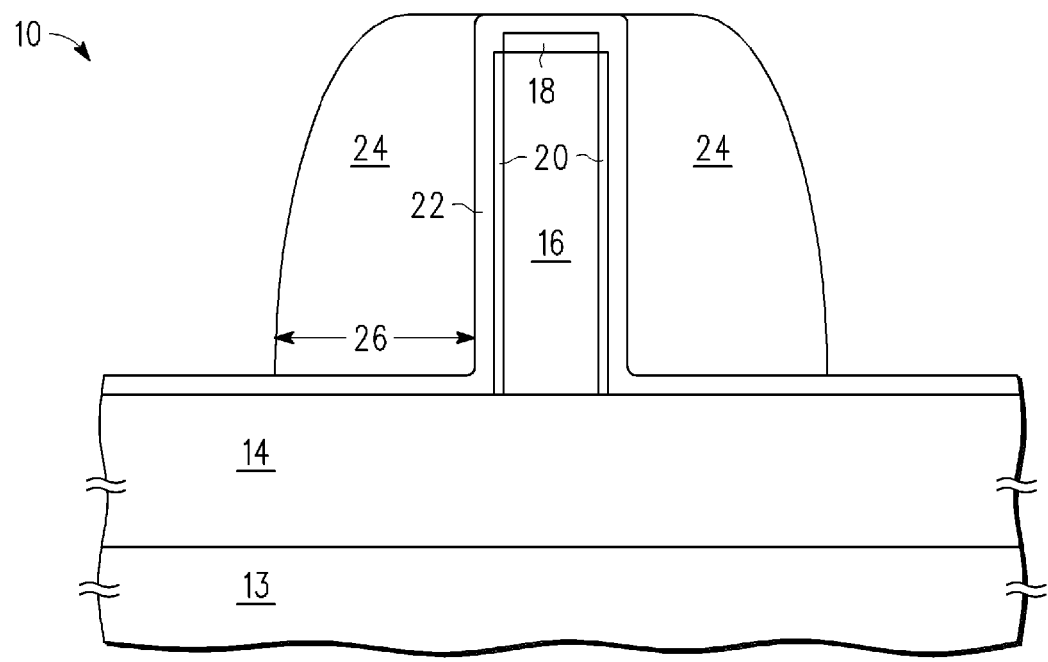
FIG. 5 is a cross section of the semiconductor device of FIG. 1 at a subsequent stage in processing

Shown in FIG. 5 is semiconductor device 10 after forming a sidewall spacer 24 around fin 16. Sidewall spacer has a base thickness 26. Sidewall spacer 24 may be an easily etched oxide such as a tetraethylorthosilicate (TEOS) or another material. Base thickness 26 is intentionally quite large compared to typical sidewall spacers. It may be for example, about 100 nm.

Figure 6:
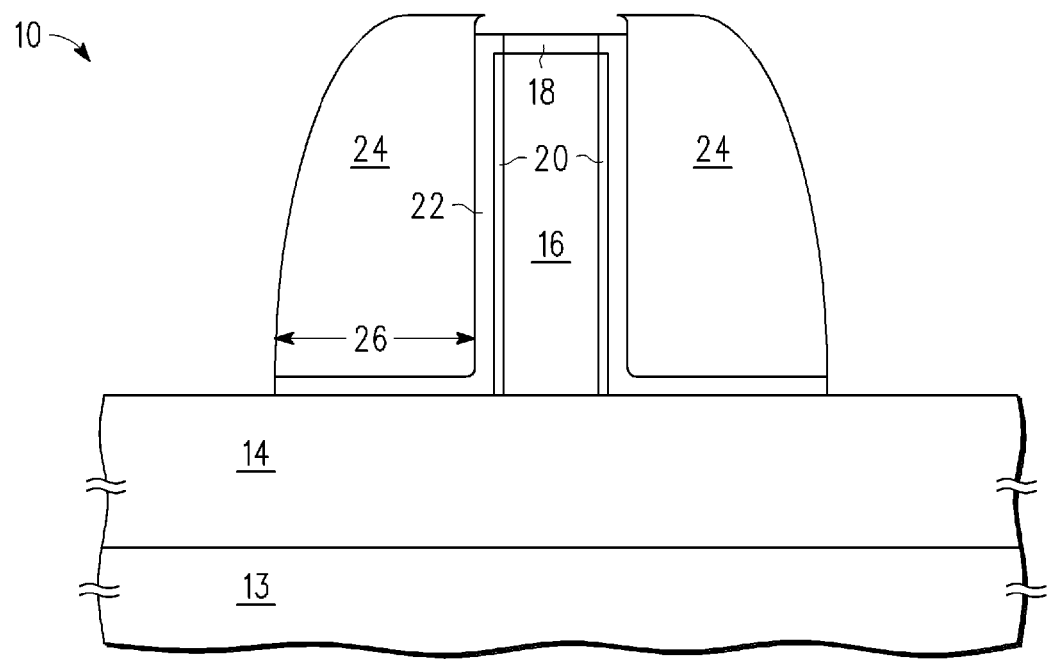
FIG. 6 is a cross section of the semiconductor device of FIG. 1 at a subsequent stage in processing

Shown in FIG. 6 is semiconductor device 10 after etching polysilicon layer 22 using sidewall spacer 24 as a mask. This removes polysilicon layer 22 from the top of fin 16 and the areas laterally adjacent to sidewall spacer 24. The result is that polysilicon layer 22 is along the sides of fin 16 and under sidewall spacer 24. The remaining portion of polysilicon layer 22 is for use as a floating gate and thus may be referenced as floating gate 22 that is L-shaped with a horizontal portion and a vertical portion.

Figure 7:
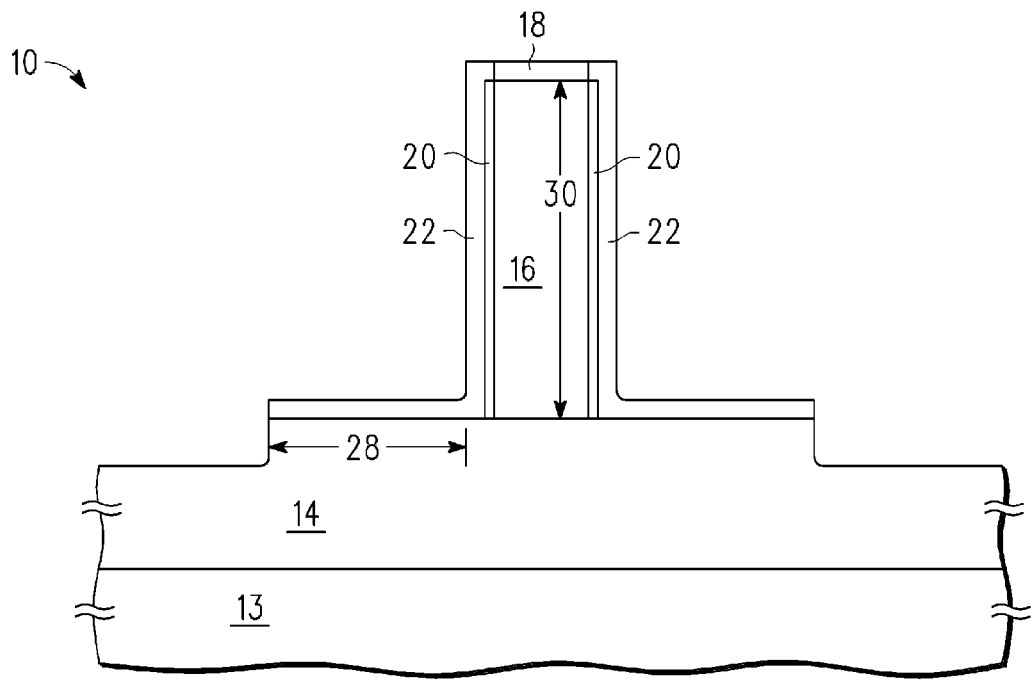
FIG. 7 is a cross section of the semiconductor device of FIG. 1 at a subsequent stage in processing

Shown in FIG. 7 is semiconductor device 10 after removing sidewall spacer 24. This is shown for the case of sidewall spacer 24 being TEOS. TEOS etches much faster than the oxide used for insulating layer 14 in an SOI substrate. Thus the etching into layer 14 is much less than the height of sidewall spacer 24. Base width 26 of sidewall spacer 24 results in a lateral extension 28 of floating gate 22. Along the side of fin 16, polysilicon layer 22 extends laterally the thickness of gate dielectric layer 20 plus the thickness of polysilicon layer 22. Thus lateral extension 28 extends from fin 16 an amount equal to base thickness 26, which is the same as lateral extension 28, plus the thickness of gate dielectric layer 20 plus the thickness of floating gate 22. Fin 16 has a height 30 which may be about 100 nm. Fin height may vary as technology changes and also with desired operation. An exemplary range for height 30 is 50 to 200 nm.

Figure 8:
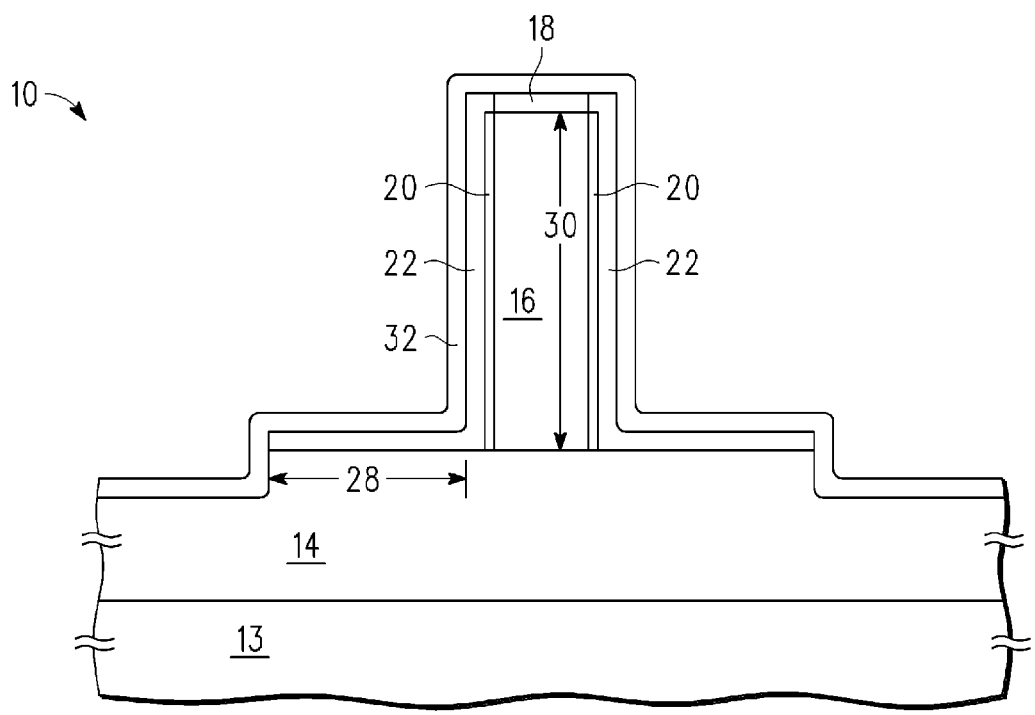
FIG. 8 is a cross section of the semiconductor device of FIG. 1 at a subsequent stage in processing

Shown in FIG. 8 is semiconductor device 10 after forming an insulating layer 32 over floating gate 22, insulating layer 18, and the exposed portion of insulating layer 14. Insulating layer 32 is for use as the insulating layer between the floating gate and control gate. Insulating layer 32 may be a stack of oxide, nitride, and oxide, which is commonly referenced as ONO. Insulating layer 32 may also be another material or combination of materials. Another material sometimes found useful for this purpose is oxynitride. Insulating layer 32 may be 10 nm.

Figure 9:
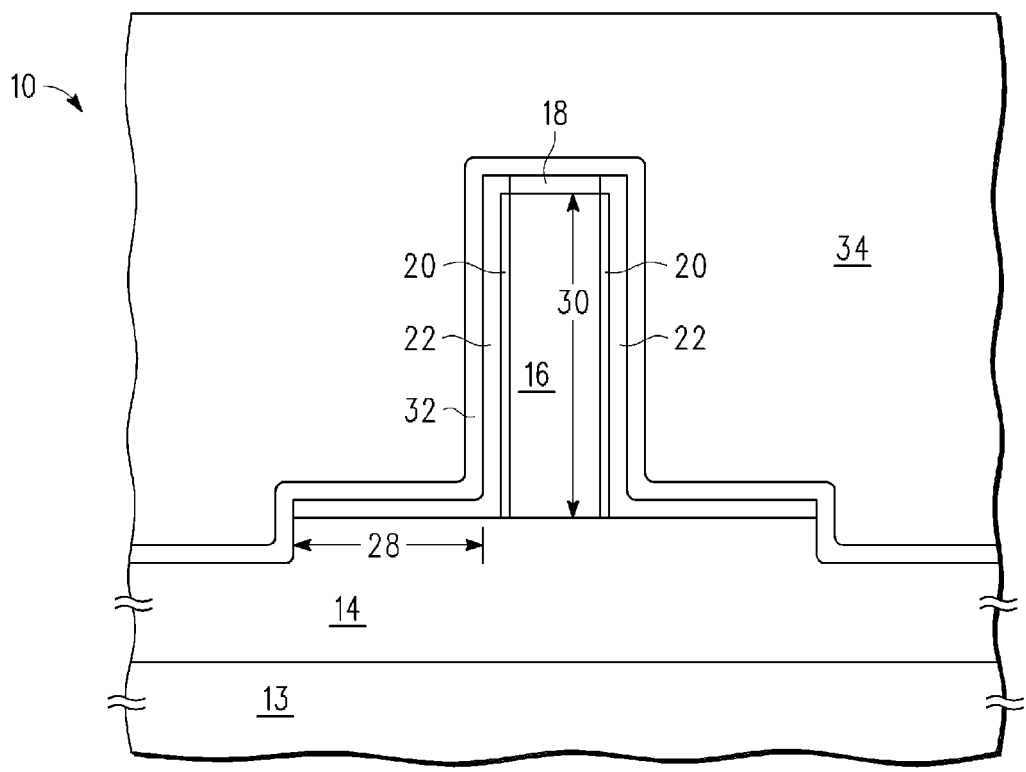
FIG. 9 is a cross section of the semiconductor device of FIG. 1 at a subsequent stage in processing showing a nearly completed memory cell.

Shown in FIG. 9 is semiconductor device 10 after forming a polysilicon layer 34 over insulating layer 32. Polysilicon layer 34 is thicker than the other layers shown and may be 200 nm. Polysilicon layer 34 is deposited and then a step of chemical mechanical polishing is performed to result in polysilicon layer 34 have a planar top surface. Polysilicon layer 34 is used as a control gate and may be referenced as control gate 34. Semiconductor device 10 as shown in FIG. 9 is a nearly completed NVM cell needing source/drains to be formed. The portion of fin 16 shown in FIG. 10 functions as a channel.

Figure 10:
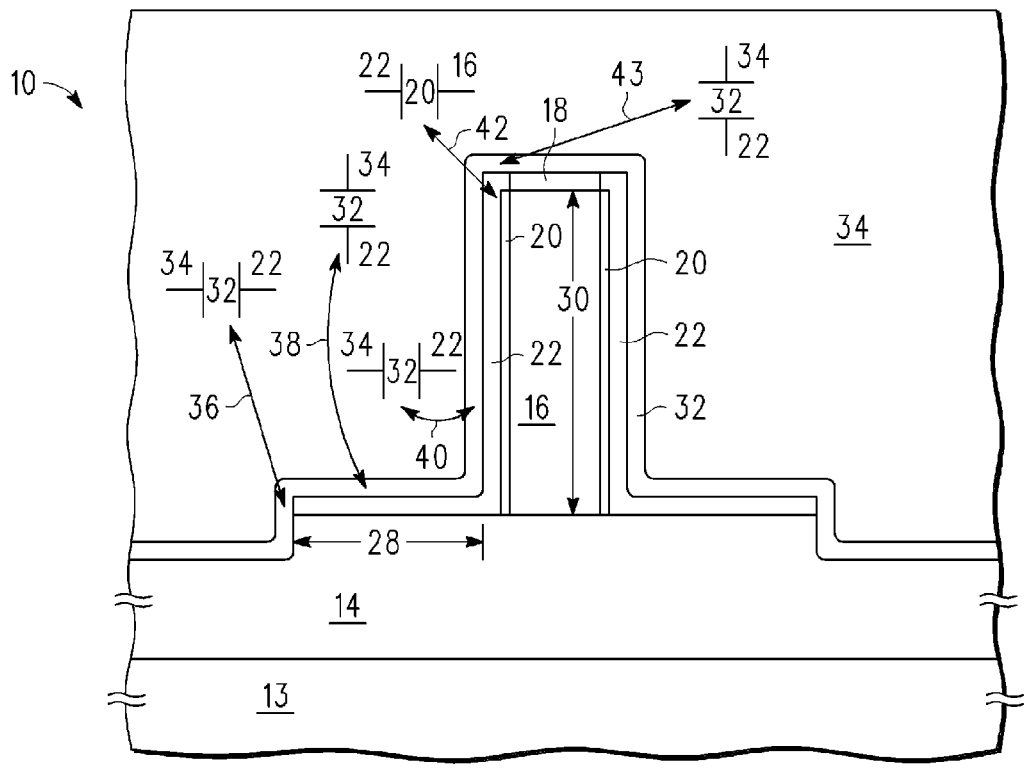
FIG. 10 is a cross section of the semiconductor device of FIG. 9 providing capacitance information.

Shown in FIG. 10 is semiconductor device 10 the same as in FIG. 9 showing details of the components of the capacitances of floating gate to control gate and floating gate to channel. The capacitance of the floating gate to control gate is the capacitance between floating gate 22 and control gate 34. The components of the floating gate to control gate capacitance are capacitance 36, capacitance 38, capacitance 40, and capacitance 43. Capacitance 36 is the relatively small capacitance at the end of the lateral extension of floating gate 22. Capacitance 38 is the relatively large capacitance at lateral extension 28. Capacitance 40 is the relatively large capacitance along the sidewall of fin 16. Capacitance 43 is the relatively small capacitance at the top side of fin 16 where floating gate 22 terminates adjacent to insulating layer 18. The floating gate to channel capacitance is also shown as capacitance 42 which is the capacitance between floating gate 22 and fin 16. The capacitances shown are just for the left half of semiconductor device 10. Both halves are the same.

Figure 11:
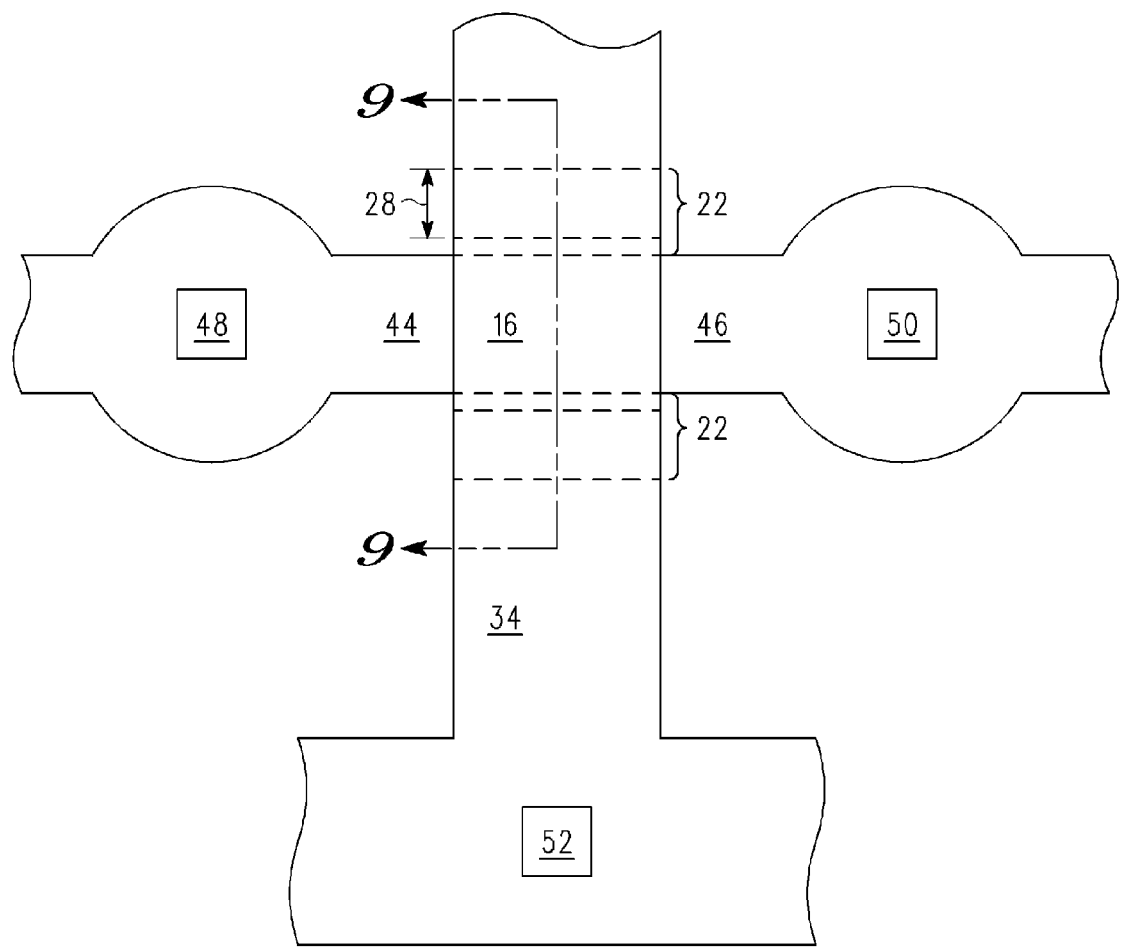
FIG. 11 is a top view of the device of FIG. 9 at a subsequent stage in processing showing a completed memory cell.

Shown in FIG. 11 is semiconductor device 10, which may be considered memory cell 10 as a completed memory cell, from a top view after etching polysilicon layer 34 into a polysilicon line useful as control gate 34 and forming source/drains 44 and 46 in fin 16 on opposing sides of control gate 34 and silicide contacts 48, 50, and 52 for source/drain 44, source/drain 46, and control gate 34, respectively.

The net effect of lateral extension 28, which may be considered a horizontal portion of the floating gate, is to increase the floating gate to control gate capacitance by a percentage approximately equal to lateral extension 28 divided by the fin height 30. Capacitance 43, which is relatively small, can be added to the denominator for a more accurate calculation. Capacitance 36 appears to be an additional capacitance as result of lateral extension 28 but the capacitance along the sidewall of fin 16 is reduced because of the thickness of floating gate 22 which is thus offset by capacitance 36 being added back. Assuming that capacitance 43 is negligible, for the case where lateral extension 28 equals fin height 30, lateral extension results in about a 100% increase in capacitance. The floating gate to control gate capacitance increase is achieved without effecting the floating gate to channel capacitance. Thus the ratio of the floating gate to control gate capacitance to the floating gate to channel capacitance is increased by the same percentage as the floating gate to control gate capacitance is increased.

Although lateral extension 28 adds a lateral dimension to the memory cell size, it will not likely reduce cell density because minimum fin spacing is much greater than two times lateral extension. 28. There will be adjacent cells on adjacent fins in a memory array. For current technology it is not unusual for minimum fin spacing is about 500 nm. Thus adjacent memory cells would be separated by 500 nm minus the cell width which is no more than 50 nm. This makes the cells separated by at least 450 nm. Lateral extension 28 of 100 nm would still leave the cells with a separation of 250 nm. Thus currently, a 50% to 100% improvement should be readily available. Although the horizontal portion of the floating gate would normally be expected to be at least one-third as long as the vertical portion of the floating gate is tall, an improvement, however, of less may still be beneficial. For example, the capacitance of capacitance 38 may be only 10% of capacitance 40 and would still be beneficial for the memory cell.

A benefit of using sidewall spacer 24 is that polysilicon layer 22 is separated into separate floating gates for the different cells without requiring a mask. Using sidewall spacer as a mask, the continuity of polysilicon layer 22 is broken and with the remaining portions being for the floating gates of the various cells. It should also be noted that with floating gate 22 separated into two unconnected portions, semiconductor structure 10 of FIGS. 9 and 11 could be altered, by separating the control gate into two sections, to operate as two separate cells or be viewed as a two bit cell.

By now it should be appreciated that there has been provided a fin field effect transistor (FinFET) memory cell. The cell includes a substrate for providing mechanical support. The cell further includes a first dielectric layer overlying the substrate. The cell further includes a fin structure overlying the dielectric layer and comprising a first current electrode and a second current electrode separated by a channel. The cell further includes a floating gate comprising a vertical portion that is adjacent to and electrically insulated from a side of the channel and comprising a horizontal portion overlying the first dielectric layer and extending laterally away from the channel, the floating gate storing electrical charge. The cell further includes a second dielectric layer adjacent the floating gate. The cell further includes a control gate adjacent the second dielectric layer and physically separated from the floating gate by the second dielectric layer. The vertical portion of the floating gate may be substantially perpendicular with the horizontal portion to form an "L" shaped floating gate. The horizontal portion of the floating gate may be at least one-third as long as the vertical portion of the floating gate is tall. The first dielectric layer may comprise a first electrically insulating material and the second dielectric layer both comprise oxide. A capacitance between the horizontal portion of the floating gate and the control gate may comprise at least ten percent of capacitance between the vertical portion of the floating gate and the control gate.

Also described is a method of forming a device. The method includes providing a substrate for providing mechanical support. The method further includes forming a first dielectric layer overlying the substrate. The method further includes forming a fin structure overlying the dielectric layer by forming a first current electrode and a second current electrode separated by a channel. The method further includes forming a floating gate for storing electrical charge comprising a vertical portion that is adjacent to an electrically insulating layer on a side of the channel and comprising a horizontal portion overlying the first dielectric layer and extending laterally away from the channel. The method further includes forming a second dielectric layer adjacent the floating gate. The method further includes forming a control gate adjacent the second dielectric layer and physically separated from the floating gate by the second dielectric layer. The method may further comprise forming a sacrificial dielectric spacer for use as a mask to protect the horizontal and vertical portions of the floating gate during a selective etch of exposed portions of floating gate material when forming the floating gate. The selective etch may electrically isolate the device from any adjoining devices. The method may further comprise implementing the insulating layer and the second dielectric layer with different dielectric materials wherein the insulating layer is formed by growing a thermal oxide and the second dielectric layer is formed by a deposition of a combination of oxide and nitride layers. The method may further comprise forming the vertical portion of the floating gate substantially perpendicular to the horizontal portion to form an "L" shaped floating gate. Forming the first current electrode and the second current electrode may further comprise implanting a predetermined dopant into the fin structure while protecting the channel of the fin structure using the control gate. The method may further comprise forming the fin structure with a height substantially in a range of fifty nanometers to two hundred nanometers.

Also described is a method of forming a fin field effect memory cell. The method includes providing a substrate. The method further includes forming a fin structure comprising a channel and source and drain regions that are separated by the channel. The method further includes forming a floating gate for storing charge within the fin field effect memory cell, the floating gate being electrically isolated from and laterally adjacent to the channel by a first distance, the floating gate further comprising a vertical portion extending substantially from a base to a top of the fin structure and comprising a horizontal portion extending laterally from the vertical portion at the base of the fin structure and overlying the substrate. The method further includes forming a control gate insulated from and adjacent to the floating gate on a first side of the floating gate that is opposite from a second side adjoining the channel. Forming the floating gate may further comprise forming a sacrificial dielectric spacer for use as a mask to protect the vertical portion and the horizontal portion of the floating gate; selectively etching exposed portions of floating gate material of the floating gate; and removing the sacrificial dielectric spacer. The method may further comprise insulating the fin structure from the substrate with a first insulating layer; and implementing the first insulating layer and the sacrificial dielectric spacer with different dielectric materials wherein the sacrificial dielectric spacer etches at a faster rate than the first insulating layer. The method may further comprise. The method may further comprise forming the fin structure with a height substantially in a range of fifty nanometers to two hundred nanometers. The method may further comprise forming the horizontal portion of the floating gate at least one-third as long as the vertical portion of the floating gate is tall. The method may further comprise implanting a predetermined dopant into the fin structure while protecting the channel of the fin structure using the control gate. The method may further comprise forming the vertical portion of the floating gate substantially perpendicular to the horizontal portion to form an "L" shaped floating gate. The method may further comprise forming the horizontal portion of the floating gate to have a length sufficient so that a first capacitance value between the control gate and the floating gate is greater than a second capacitance value between the channel and the floating gate.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, specific dimension were used other dimensions may be effective. Also, insulating layer 18 is shown in the final memory cell, this may be removed and another insulating layer formed. Also the particular materials described may not be required. The control gate, for example, was described as being polysilicon but another conductive material may also be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a device comprising:
providing a substrate for providing mechanical support;
forming a first dielectric layer overlying the substrate;
forming a fin structure overlying the dielectric layer by forming a first current electrode and a second current electrode separated by a channel;
forming a floating gate for storing electrical charge comprising a vertical portion that is adjacent to an electrically insulating layer on a side of the channel and comprising a horizontal portion overlying the first dielectric layer and extending laterally away from the channel;
forming a second dielectric layer adjacent the floating gate; and
forming a control gate adjacent the second dielectric layer and physically separated from the floating gate by the second dielectric layer.

2. The method of claim 1 further comprising:
forming a sacrificial dielectric spacer for use as a mask to protect the horizontal and vertical portions of the floating gate during a selective etch of exposed portions of floating gate material when forming the floating gate.

3. The method of claim 2 wherein the selective etch electrically isolates the device from any adjoining devices.

4. The method of claim 1 further comprising:
implementing the insulating layer and the second dielectric layer with different dielectric materials wherein the insulating layer is formed by growing a thermal oxide and the second dielectric layer is formed by a deposition of a combination of oxide and nitride layers.

5. The method of claim 1 further comprising:
forming the vertical portion of the floating gate substantially perpendicular to the horizontal portion to form an "L" shaped floating gate.

6. The method of claim 1 wherein forming the first current electrode and the second current electrode further comprise:
implanting a predetermined dopant into the fin structure while protecting the channel of the fin structure using the control gate.

7. The method of claim 1 further comprising:
forming the fin structure with a height substantially in a range of fifty nanometers to two hundred nanometers.

8. A method of forming a fin field effect memory cell, comprising:
providing a substrate;
forming a fin structure comprising a channel and source and drain regions that are separated by the channel;
forming a floating gate for storing charge within the fin field effect memory cell, the floating gate being electrically isolated from and laterally adjacent to the channel by a first distance, the floating gate further comprising a vertical portion extending substantially from a base to a top of the fin structure and comprising a horizontal portion extending laterally from the vertical portion at the base of the fin structure and overlying the substrate; and
forming a control gate insulated from and adjacent to the floating gate on a first side of the floating gate that is opposite from a second side adjoining the channel.

9. The method of claim 8 wherein forming the floating gate further comprises:
forming a sacrificial dielectric spacer for use as a mask to protect the vertical portion and the horizontal portion of the floating gate;
selectively etching exposed portions of floating gate material of the floating gate; and
removing the sacrificial dielectric spacer.

10. The method of claim 9 further comprising:
insulating the fin structure from the substrate with a first insulating layer; and
implementing the first insulating layer and the sacrificial dielectric spacer with different dielectric materials wherein the sacrificial dielectric spacer etches at a faster rate than the first insulating layer.

11. The method of claim 8 further comprising:
forming the fin structure with a height substantially in a range of fifty nanometers to two hundred nanometers.

12. The method of claim 8 further comprising:
forming the horizontal portion of the floating gate at least one-third as long as the vertical portion of the floating gate is tall.

13. The method of claim 8 further comprising:
implanting a predetermined dopant into the fin structure while protecting the channel of the fin structure using the control gate.

14. The method of claim 8 further comprising:
forming the vertical portion of the floating gate substantially perpendicular to the horizontal portion to form an "L" shaped floating gate.

15. The method of claim 8 further comprising:
forming the horizontal portion of the floating gate to have a length sufficient so that a first capacitance value between the control gate and the floating gate is greater than a second capacitance value between the channel and the floating gate.

16. The method of claim 8, wherein the step of forming comprises:
forming a gate dielectric on the fin;
forming a layer of floating gate material over the fin and an area adjacent to the fin;
forming sidewall spacer along adjacent to a sidewall of the fin and on the layer of floating gate material;
performing an etch of the layer of the floating gate material using the sidewall spacer as a mask to leave a vertical portion of the floating gate material between the sidewall spacer and the fin and a horizontal portion under the sidewall spacer; and
removing the sidewall spacer prior to forming the control gate.

17. The method of claim 1 further comprising:
forming a gate dielectric on the fin;
forming a layer of floating gate material over the fin and an area adjacent to the fin;
forming sidewall spacer along adjacent to a sidewall of the fin and on the layer of floating gate material;
performing an etch of the layer of the floating gate material using the sidewall spacer as a mask to leave a vertical portion of the floating gate material between the sidewall spacer and the fin and a horizontal portion under the sidewall spacer; and
removing the sidewall spacer prior to forming the second dielectric layer.

* * * * *